United States Patent
Duivenvoorden et al.

(10) Patent No.: US 10,499,522 B2
(45) Date of Patent: Dec. 3, 2019

(54) HOUSING PART FOR A MEASUREMENT DEVICE HAVING A MICROWAVE-PERMEABLE GLASS OR CERAMIC WINDOW

(71) Applicant: Siemens Aktiengesellschaft, Munich (DE)

(72) Inventors: Johannes Theodorus Cornelis Duivenvoorden, Trent River (CA); Truc Tran-Ngoc, Mississauga (CA)

(73) Assignee: Siemens Aktiengesellschaft, Munich (DE)

( * ) Notice: Subject to any disclaimer, the term of this patent is extended or adjusted under 35 U.S.C. 154(b) by 373 days.

(21) Appl. No.: 15/365,543

(22) Filed: Nov. 30, 2016

(65) Prior Publication Data
US 2017/0164494 A1    Jun. 8, 2017

(30) Foreign Application Priority Data

Dec. 2, 2015   (EP) .................................... 15197600

(51) Int. Cl.
*H05K 5/04* (2006.01)
*G01F 23/284* (2006.01)
(Continued)

(52) U.S. Cl.
CPC ............ *H05K 5/04* (2013.01); *G01F 23/284* (2013.01); *G01S 2007/027* (2013.01); *H01P 1/08* (2013.01); *H01Q 1/225* (2013.01)

(58) Field of Classification Search
CPC ...... H05K 5/00; H05K 5/0004; H05K 5/0091; H05K 5/02; H05K 5/04; H05K 5/062;
(Continued)

(56) References Cited

U.S. PATENT DOCUMENTS

| 2,744,592 A | 5/1956 | Remond |
| 4,961,628 A | 10/1990 | Herberts |

(Continued)

FOREIGN PATENT DOCUMENTS

| DE | 199 10 270 A1 | 9/2000 |
| EP | 1 099 650 A1 | 5/2001 |

*Primary Examiner* — Bernarr E Gregory
*Assistant Examiner* — Daniel P Malley, Sr.
(74) *Attorney, Agent, or Firm* — Cozen O'Connor

(57) ABSTRACT

A housing part for a measurement device includes a single metal body having an outer circumferential side wall with an upper end and a lower end and an inner disc-shaped base wall located between the upper and lower ends, wherein the side wall and the base wall define two partially enclosed areas, where the base wall comprises a central hole into which a microwave-permeable glass or ceramic window is fused, microwave guides and dielectric matching elements are provided on both sides of the microwave-permeable or ceramic window to propagate microwaves between the desired points such as a radar antenna and radar electronics, and where the matching elements not only adjust the impedance of the microwave window to the impedances of the microwave guides but also put additional compression stress on the surfaces of the fused window, which are preferably ground flat to be flush with those of the center portion.

9 Claims, 1 Drawing Sheet

(51) Int. Cl.
  *G01S 7/02*   (2006.01)
  *H01P 1/08*   (2006.01)
  *H01Q 1/22*   (2006.01)

(58) Field of Classification Search
  CPC ......... H05K 5/069; G01F 23/00; G01F 23/02;
  G01F 23/28; G01F 23/284; G01S
  2007/027; G01S 13/88; G01S 13/882;
  H01P 1/08; H01Q 1/12; H01Q 1/22;
  H01Q 1/225
  See application file for complete search history.

(56) References Cited

U.S. PATENT DOCUMENTS

| | | | |
|---|---|---|---|
| 5,507,181 A * | 4/1996 | Fox | G01F 23/284 |
| | | | 342/124 |
| 5,770,990 A | 6/1998 | Lubbers | |
| 6,359,742 B1 | 3/2002 | Canty et al. | |
| 6,639,745 B1 | 10/2003 | Cheng | |
| 2002/0053238 A1 | 5/2002 | Fahrenbach et al. | |
| 2002/0067229 A1 | 6/2002 | Lubbers | |
| 2007/0115196 A1* | 5/2007 | Motzer | G01F 23/284 |
| | | | 343/786 |
| 2009/0114012 A1 | 5/2009 | Becherer et al. | |
| 2010/0231438 A1* | 9/2010 | Ohlsson | G01F 23/284 |
| | | | 342/124 |
| 2012/0206290 A1* | 8/2012 | Wegemann | G01F 23/284 |
| | | | 342/124 |

* cited by examiner

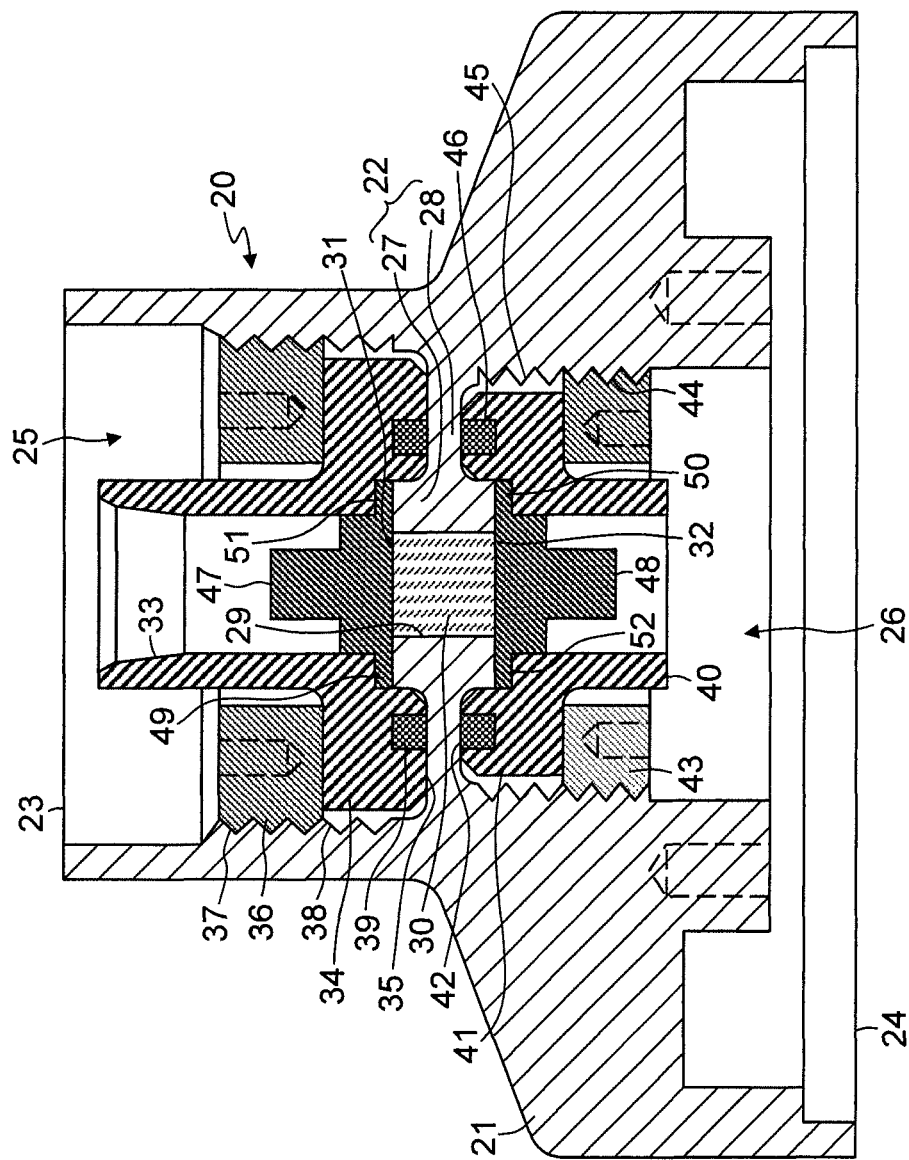

HOUSING PART FOR A MEASUREMENT DEVICE HAVING A MICROWAVE-PERMEABLE GLASS OR CERAMIC WINDOW

BACKGROUND OF THE INVENTION

1. Field of the Invention

The invention relates to a housing part for a measurement device having a microwave-permeable glass or ceramic window.

2. Description of the Related Art

Measurement devices are often installed in explosion-hazard environments or are mounted to plant components, such as vessels or pipework, with high pressure and temperature inside. The housing of such measurement devices may be equipped with a glass or ceramic window for observation purposes or as a lead-through for optical or microwave signals out of the housing into the environment or plant component and/or vice versa. In order to withstand the pressure from inside the plant component or resulting from an explosion within the housing, the window is hermetically sealed to the part of the housing in which it is disposed. Depending on requirements, the housing may be hermetically sealed, pressure-resistant or explosion-proof.

U.S. Pat. No. 4,961,628 discloses a disk-type window assembly for observing the interior of a gas-tight and pressure-tight closed chamber, where the window assembly comprises a cylindrical frame in the form of an outer ring made of metal and a window in the form of a transparent insert arranged within the frame. The frame is preferably made of stainless steel, and the insert is made of glass, such as borosilicate glass, which is fused into the frame. Having a higher coefficient of thermal expansion than that of the glass insert, the metal outer ring will exert a radial compression force on the glass after the window assembly is cooled down from the fusing temperature. This creates radial compression stresses that preload the glass window and provide it with the ability to withstand various loading conditions during operation, such as bending due to pressure on one side or a sudden change of temperature received on the glass surface. The glass window only cracks when the precompression stresses are completely annulled by the stresses from operating conditions.

Such glass window assemblies are typically mounted and sealed (e.g., by screwing or clamping) to the wall of a container, a vessel or a housing to form a fully sealed enclosure. An example is the case of an explosion proof enclosure used in electrical applications where the glass window has to be designed to withstand the internal explosion pressure.

US 2009/0114012 A1, for example, discloses a radiometric filling level indicator having an explosion-proof housing and compression glass lead-through with the glass fused into a frame. The frame has an outer thread to screw the compression glass lead-through to the housing.

U.S. Pat. No. 6,639,745 B1 discloses an observation window of a hyperbaric oxygen chamber, where a holding frame for the window is joined to a wall of the chamber via solder welding. The frame has an annular holding portion defining a central observation hole into which the window is closely fitted. The window is secured from falling out by an O-ring, which further prevents gas from traveling through the joint between the window and the frame. The frame has an annular space formed between its outer annular connecting portion and an outward section of the inner annular holding portion of the frame for reducing effects of deformation of the outer annular connecting portion on the inner holding portion that may be caused by high temperature of the solder welding.

DE 199 10 270 A1 discloses a window assembly to be used in a radar level gauge, where instead of fusing a glass or ceramic into a metal frame, a metal jacket is fused or sintered to the rim of a microwave-permeable window.

U.S. Pat. No. 6,359,742 B1 discloses a sight glass assembly adapted for welding to a vessel wall. The sight glass assembly comprises a transparent window disc, an annular frame that is fused to and encloses the window disc, and a flange. The flange is thinner than the frame and extends radially from one edge of the frame to form a flush surface coextensive with a surface of the window disc and the frame. The flange has an annular groove surrounding the frame and window disc. As the perimeter of the flange is welded into an opening of the vessel wall, thermal expansion might create stress throughout the assembly. However, the groove will absorb the stresses without transmitting to the glass viewing portion of the assembly and thus protects the integrity of the entire unit.

US 2002/0067229 A1 and U.S. Pat. No. 5,770,990 each disclose a microwave window assembly for spatial separation and microwave-transmitting connection between an external microwave conductor and an internal microwave conductor or horn antenna of a radar level gauge. The external microwave conductor is outside a container holding a medium, the level of which is to be measured. The window assembly comprises a microwave-permeable window and a metal frame into which the window is fused or glued. The window assembly, or more precisely its frame, is mounted or bolted directly between flanges of the microwave conductors or, as shown in U.S. Pat. No. 5,770,990, between the flange of the external microwave conductor and the wall of the container. U.S. Pat. No. 5,770,990 also discloses the possibility of sealing or sintering the window directly into the wall of the container. In order to adjust the impedance of the microwave window to the impedance of the external microwave conductor or the internal microwave conductor, cone-shaped matching elements made of dielectric material may be provided on both sides of the microwave window.

US 2002/0053238 A1 discloses a housing part for a microwave level measuring device which may be mounted on a wall of a container at a measurement hole through it. The housing part comprises a mounting flange into which a metal waveguide jacket is inserted and welded. The metal jacket has a flat center portion of reduced wall thickness with a central hole into which a microwave-permeable glass or ceramic window is fused. The window forms flush surfaces coextensive with the upper and lower surfaces of the jacket's center portion. A hollow waveguide is mounted in the upper side of the jacket. For better matching of the microwaves with a horn antenna, a tapered dielectric matching element is attached to the lower side of the jacket with a holding ring that has an external thread and is screwed into an internal thread section of the jacket.

EP 1 009 650 A1 discloses a manhole cover plate with a central orifice into which a sight glass is fused. A concentric groove on the upper side or lower side of the plate around the glass prevents stress on it.

U.S. Pat. No. 2,744,592 discloses a flat circular waveguide window comprising a glass center and a surrounding metal frame to which the glass is fused. The metal frame is composed of an annular outer frame portion and an inner frame portion. The outer and an inner frame portions are connected by a zone of reduced thickness that reduces the possibility of transmission of cooling stresses from the outer frame portion to the glass center.

SUMMARY OF THE INVENTION

It is an object of the invention to provide an attachment of a glass or ceramic window in a housing part of a measurement device, in particular a radar level transmitter, which attachment is pressure-resistant and stable against temperature changes and permits a hermetically sealed separation between the areas on both sides of the window, with the window being mounted in a simple and cost-effective yet secure manner.

This and other objects and advantages are achieved in accordance with the invention by a housing part for a measurement device, where the housing part includes a microwave-permeable glass or ceramic window and comprises a single body made of metal, where the single body has an outer circumferential side wall with an upper end and a lower end and an inner disc-shaped base wall located between the upper and lower ends, the side wall and base wall defining two partially enclosed areas.

The base wall comprises a flat circular center portion surrounded by an annular zone of reduced wall thickness on both upper and lower surfaces of the base wall, where the circular center portion projects above and below the surrounding annular zone of reduced wall thickness.

The center portion comprises a central hole into which the glass or ceramic window is fused, where the window forms flush surfaces coextensive with the upper and lower surfaces of the circular center portion.

The upper one of the two partially enclosed areas accommodates a first dielectric matching element and a first microwave guide, where the first dielectric matching element has a bottom flange portion that is pressed against and radially interferes with the upper surface of the circular center portion of the base wall.

The first microwave guide at a first end face is pressed against the upper surface of the base wall outside its circular center portion and has an inner shoulder for accommodating and matching with the bottom flange portion of the first dielectric matching element.

The lower one of the two partially enclosed areas accommodates a second dielectric matching element and a second microwave guide. In addition, the second dielectric matching element has a bottom flange portion that is pressed against and radially interferes with the lower surface of the circular center portion of the base wall; and the second microwave guide at a second end face is pressed against the lower surface of the base wall outside its circular center portion and has an inner shoulder for accommodating and matching with the bottom flange portion of the second dielectric matching element.

In an embodiment of the invention, the housing part for the measurement device includes a microwave-permeable glass or ceramic window and comprises a single body made of metal having an outer circumferential side wall with an upper end and a lower end and an inner disc-shaped base wall located between the upper and lower ends, where the side wall and the base wall define two partially enclosed areas.

The base wall comprises a flat circular center portion surrounded by an annular zone of reduced wall thickness on both upper and lower surfaces of the base wall, where the circular center portion projects above and below the surrounding annular zone of reduced wall thickness.

The center portion comprises a central hole into which the glass or ceramic window is fused.

The upper one of the two partially enclosed areas accommodates a first microwave guide that has a first flange having an inner diameter corresponding to the outer diameter of the circular center portion and providing a first end face with which the first microwave guide is pressed against the upper surface of the base wall outside its circular center portion.

In addition, the lower one of the two partially enclosed areas accommodates a second microwave guide that has a second flange having an inner diameter corresponding to the outer diameter of the circular center portion and providing a second end face with which second microwave guide is pressed against the lower surface of the base wall outside its circular center portion.

Thus, in order to simplify the configuration to improve manufacturing logistics and to reduce the parts cost, the glass or ceramic window is directly fused into the hole provided in the base wall of the housing part. In addition, there are certain explosion-proof requirements that do not allow the use of threads or clamps to create a boundary between areas with different probability of occurrence of explosive atmospheres, such as areas classified as Zone 1 and Zone according to International Electromechanical Commission (IEC) or division 1 and division 2 according to National Electrical Code (NEC). In this case, a window that is directly fused into the enclosure both avoids the needs for threads or clamps and allows the device to form a boundary between, e.g., a Zone 1 area and a Zone 2 area. When cooled down from the fusing temperature, the circular center portion of the base wall will exert a compressive preload to the window allowing it to withstand various loading conditions during operation. However, in this case of direct glass or ceramic fusion into a metal housing part, the resulting internal stress inside the assembly after fusion is more complex. Depending on the thermal properties of the different materials (glass and metal) and due to non-uniform contraction of the housing part when using the measurement device in, e.g., industrial environments, a bending stress may be created on the window, where the bending stress reduces or even eliminates the compressive preload to the window. In accordance with the invention, the annular zone of reduced wall thickness on both upper and lower surfaces of the base wall effectively and efficiently decouples such bending loading of the housing part from the glass or ceramic window to preserve the precompression stress on the surface of the window.

The dimension of the zone of reduced wall thickness can be tailored to maximize the decoupling effect for a given load handing requirement of the window and improve the robustness of the configuration. The circular center portion of the base wall advantageously projects above and below the surrounding annular zone of reduced wall thickness, which allows for easier and more precise machining of the outside diameter of the circular center portion, its upper and lower surfaces and the inside diameter of the circular hole. This is particularly important as the window serves as a lead-through for optical or microwave signals, such as in a radar level transmitter. Microwave guides and dielectric matching elements are provided on both sides of the microwave window to propagate microwaves between the desired points, such as a radar antenna and the radar electronics. A precise radial alignment of the waveguides and matching elements to the microwave window on both sides is very critical to good microwave transmission. The outside diameter of the circular center portion and the inside diameter of the hole for the window may be machined in the same set up and prior to glass fusing to achieve the required concentricity between these features. This allows the waveguides to be press-fitted to the circular center portion for alignment with no clearance or dimensional stack up. The dielectric matching elements may be accurately located and held in place by the respective waveguides on assembly. In this arrangement, the matching elements not only adjust the impedance of the microwave window to the impedances of the microwave guides but also place additional compression stress on the surfaces of the window, which are preferably ground flat to be flush with those of the center portion.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be now described by way of example and with reference to the accompanying drawing, of which:

The single FIGURE is a longitudinal sectional view through a housing part of a radar level transmitter in accordance with a preferred embodiment of the present invention.

DETAILED DESCRIPTION OF THE EXEMPLARY EMBODIMENTS

The housing part comprises a one-piece single metal body 20 of axial symmetry that has an outer circumferential side wall 21 with varying outer diameter and wall thickness and an inner disc-shaped base wall 22. The side wall 21 provides, at an upper end 23, a connection facility for welding or otherwise fastening an electronics housing portion (not shown), and, at a lower end 24, a coupling interface structure for connecting an antenna, such as a horn antenna (not shown).

The base wall 22 is situated more or less in the middle between the upper end 23 and the lower end 24, thus defining, together with the side wall 21, an upper partially enclosed area 25 and a lower partially enclosed area 26. The base wall 22 comprises a flat circular center portion 27 that projects above and below a surrounding annular zone 28 of reduced wall thickness. Additionally, a pair of annular grooves may be recessed in the annular zone 28, where this is connected to the center portion 27. The center portion 27 comprises a central hole 29 into which a microwave-permeable window 30 is fused. The metal body 20 is preferably of stainless steel and the window 30 is of borosilicate glass. The circular center portion 27 and the glass insert 30 are preferably ground flat to create substantially flush upper surfaces 31 and flush lower surfaces 32.

When cooled down from the fusing temperature, the circular center portion 27 applies a compressive preload to the window 30. However, non-uniform contraction of the metal body 20 or thermal and mechanical loading during operation as a part of the radar level transmitter could lead to the creation of secondary bending stress on the window 30 so that the compressive stress on one of the upper and lower surfaces 31, 32 decreases and turns into tension stress which, in turn, would lead to glass cracking. The annular zone 28 of reduced wall thickness of the base wall 22 advantageously decouples such bending loading of the housing part from the window 30, thus preserving the precompression stress on the window 30.

The upper partially enclosed area 25 of the housing part accommodates a first hollow microwave guide 33 that has a first flange 34 providing a first end face 35. A first thrust collar 36 having an external thread 37 is screwed into a first internal thread section 38 of the partially enclosed area 25. Being provided on the first microwave guide 33, the first thrust collar 36 presses the first flange 34 with the first end face 35 against the upper surface of the base wall 22 outside its circular center portion 27, which is the annular zone 28 of reduced wall thickness. Alternatively, the first microwave guide 33 could be provided with an external thread and could be screwed into the first internal thread section 38. The inner diameter of the flange 34 corresponds to the outer diameter of the circular center portion 27 so that the microwave guide 33 is placed by press-fit in accurate alignment to the window 30. To provide a good seal between the first microwave guide 33 and the base wall 22, a first sealing-ring 39 may be located in an annular groove that is formed in the first end face 35 of the first flange 34 or in the upper surface of the annular zone 28 of the base wall 22. The groove is mainly present to accommodate expansion during the interference fit process of the waveguide 33 to the circular center portion 27 with the fused window 30. The groove reduces stress to the window 30 in comparison to a waveguide that does not have such a groove.

A second hollow microwave guide 40 with a second flange 41 providing a second end face 42 is arranged in the lower partially enclosed area 26 of the housing part. A second thrust collar 43 having an external thread 44 is screwed into a second internal thread section 45 of the lower partially enclosed area 26. Being provided on the second microwave guide 40, the second thrust collar 43 presses the second flange 41 with its end face 42 against the lower surface of the annular zone 28 of the base wall 22. A second sealing-ring 46 may be located in an annular groove that is formed in the second end face 42 of the second flange 41 or in the lower surface of the annular zone 28 of the base wall 22. Here, the annular groove primarily serves to also accommodate expansion during the interference fit process of the second microwave guide 40 to the circular center portion 27 with the fused window 30.

In order to adjust the impedance of the microwave-permeable window 30 to the impedances of the microwave guides 33 40, stepped or tapered, such as cone-shaped, matching elements 47, 48 of dielectric material may be provided on both sides of the window 30. Each of the matching elements 47, 48 has a bottom flange portion 49, 50 with substantially the same diameter as that of the circular center portion 27 of the base wall 22. The first flange 34 of the first microwave guide 33 has a first inner shoulder 51 for accommodating and matching with the bottom flange portion 49 of the first matching element 47 and pressing it against the upper surface of the window 30 and circular center portion 27. Likewise, the second flange 41 of the second microwave guide 40 has a second inner shoulder 52 for accommodating and matching with the bottom flange portion 50 of the second matching element 48 and pressing it against the lower surface of the window 30 and circular center portion 27.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those element which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A housing part for a measurement device, said housing part having a microwave-permeable window made of glass or ceramic, and said housing part comprising:
    a single body made of metal and having an outer circumferential side wall with a first end and a second end, and having an inner disc-shaped base wall located between the first and second ends, the outer circumferential side wall and the inner disc-shaped base wall defining two partially enclosed areas;
    wherein the inner disc-shaped base wall comprises a flat circular center portion surrounded by an annular zone of reduced wall thickness on first and second surfaces of the inner disc-shaped base wall, the flat circular center portion projecting above and below the surrounding annular zone of reduced wall thickness;
    wherein the flat circular center portion comprises a central hole into which the microwave-permeable window is fused, the microwave-permeable window forming flush surfaces coextensive with first and second surfaces of the flat circular center portion;
    wherein a first partially enclosed area of the two partially enclosed areas accommodates a first dielectric matching element and a first microwave guide;
    wherein the first dielectric matching element has a first flange portion which is pressed against and radially interferes with the first surface of the flat circular center portion of the inner disc-shaped base wall;
    wherein the first microwave guide includes a first flange having an inner diameter corresponding to an outer diameter of the flat circular center portion and providing a first end face with which the first microwave guide is pressed against the first surface of the inner disc-shaped base wall outside its flat circular center portion;
    wherein the first microwave guide includes an inner shoulder for accommodating and matching with the first flange portion of the first dielectric matching element;
    wherein a second partially enclosed area of the two partially enclosed areas accommodates a second dielectric matching element and a second microwave guide;
    wherein the second dielectric matching element has a second flange portion that is pressed against and radially interferes with the second surface of the flat circular center portion of the inner disc-shaped base wall;
    wherein the second microwave guide includes a second flange having an inner diameter corresponding to the outer diameter of the flat circular center portion and providing a second end face with which the second microwave guide is pressed against the second surface of the inner disc-shaped base wall outside its flat circular center portion; and
    wherein the second microwave guide includes an inner shoulder for accommodating and matching with the second flange portion of the second dielectric matching element.

2. The housing part of claim 1, wherein the first and second surfaces of the flat circular center portion are ground flat.

3. The housing part of claim 1, further comprising:
    a first thrust collar arranged on the first microwave guide to press the first flange with the first end face against the first surface of the inner disc-shaped base wall; and
    a second thrust collar arranged on the second microwave guide to press the second flange with the second end face against the second surface of the inner disc-shaped base wall.

4. The housing part of claim 3, wherein the first and second thrust collars each include an external thread for screwing into respective first and second internal thread sections of the housing part.

5. The housing part of claim 1, wherein at least one dielectric matching element has a tapered or stepped profile.

6. A measurement device having a housing comprising the housing part of claim 1.

7. The measurement device of claim 6, wherein the measuring device comprises a radar level transmitter.

8. The housing part of claim 2, wherein at least one dielectric matching element has a tapered or stepped profile.

9. The housing part of claim 2, further comprising:
    a first thrust collar arranged on the first microwave guide to press the first flange with the first end face against the first surface of the inner disc-shaped base wall; and
    a second thrust collar arranged on the second microwave guide to press the second flange with the second end face against the second surface of the inner disc-shaped base wall.

* * * * *